United States Patent [19]
Horvath et al.

[11] Patent Number: 5,751,132
[45] Date of Patent: May 12, 1998

[54] ELECTRIC MOTOR MONITORING CIRCUIT

[75] Inventors: Joseph G. Horvath, Astatula; James C. Miller, Tavares, both of Fla.

[73] Assignee: Automeg, Inc., Astatula, Fla.

[21] Appl. No.: 717,255

[22] Filed: Sep. 20, 1996

[51] Int. Cl.$^6$ .................................................. H02P 5/28
[52] U.S. Cl. ............... 318/798; 318/490; 318/799–815; 324/107; 361/76; 361/92; 361/42
[58] Field of Search .................... 318/490, 798–875; 324/107, 511; 361/76, 92, 42, 90; 340/647

[56] References Cited

U.S. PATENT DOCUMENTS

| | | | |
|---|---|---|---|
| 4,333,050 | 6/1982 | Yeasting | 324/107 |
| 4,333,119 | 6/1982 | Schoenmeyr | 361/76 |
| 4,507,713 | 3/1985 | Hsieh | 361/92 |
| 4,540,922 | 9/1985 | Horvath et al. | 318/490 |
| 4,716,487 | 12/1987 | Horvath et al. | 361/42 |
| 4,823,227 | 4/1989 | Grant | 361/90 |
| 4,825,328 | 4/1989 | Izaguirre, Sr. | 361/90 |
| 5,224,010 | 6/1993 | Tran et al. | 361/90 |
| 5,239,439 | 8/1993 | Lee | 361/90 |
| 5,315,256 | 5/1994 | Schuyler | 324/511 |

*Primary Examiner*—Karen Masih
*Attorney, Agent, or Firm*—William M. Hobby, III

[57] ABSTRACT

An electric motor monitoring circuit apparatus for an electric motor has a three phase electric motor having an electric motor starter circuit. An insulation monitoring circuit is coupled to the electric motor and monitors insulation leakage of the electric motor and inhibits activation of the electric motor starter circuit when an insulation leakage exceeds a preselected threshold. A three phase monitor circuit is coupled to the electric motor for monitoring phase sequence in voltage amplitude for the electric motor.

6 Claims, 1 Drawing Sheet

ELECTRIC MOTOR MONITORING CIRCUIT

BACKGROUND OF THE INVENTION

The present invention relates to an electric motor and electric motor monitoring circuit and especially to an electric motor monitoring circuit which monitors insulation leakage of an electric motor and monitors phase sequence and voltage amplitude to inhibit the operation of the electric motor which does not pass phase or insulation testing.

In the past, insulation testers have been installed on electric motors to protect expensive equipment in the event of an insulation breakdown, such as might occur from old age, partial burnout, or moisture penetration into the motor housing. An insulation tester blocks out the motor's operation if the insulation resistance is below a set resistance and may also energize an alarm relay. A good example of an insulation testing circuit can be seen in our prior U.S. Pat. No. 4,716,487 to Horvath et al., for an apparatus for monitoring motor winding leakage. This system automatically monitors the insulation leakage resistance of an electric motor for a short period prior to operation thereof and has timing means for delaying application of the motor control voltage to the motor and for applying an high voltage direct current to the windings of the motor during this short period. A sensing resistor is connected between the motor frame and the high voltage supply ground and the leakage current therethrough is monitored by a comparator. When the leakage current exceeds a preselected threshold, an alarm is initiated and operation of the motor is inhibited.

Phase monitors have also been installed in connection with electric motors to monitor three phase power line for anomalies to determine power line disruptions, such as phase loss, phase imbalance, phase reversal, and low or high voltage, while the motor is operational. A power line problem can cause extensive damage to equipment over a period of time. Phase loss alone can burnout an expensive motor beyond repair in less than 24 hours. Such monitors operate continuously during the operation of the motor while the monitoring of motor winding leakage is normally tested prior to starting of the motor. A typical three phase monitor circuit can be seen in the Grant U.S. Pat. No. 4,823,227. Solid state circuitry is designed to protect three phase electrical equipment operating from 240 to 480 volts for loss of any phase, phase reversal, or under voltage or over voltage of the power supply. If the phasing or voltage in the motor are correct, the motor will energize an output relay to enable the load to operate the protected equipment.

Other prior U.S. patents relating to monitoring of an electric motor circuit or the like include the Schuyler U.S. Pat. No. 5,315,256, for a fault detection circuit for use in determining the existence of a fault in any one of a plurality of DC loads and uses a reference load as a benchmark. The center points of the loads being monitored are compared with the voltage of the center point of the reference load. The Lee U.S. Pat. No. 5,239,439, is a protection circuit for a power supply system. The Tran et al. U.S. Pat. No. 5,224,010, is a power supply supervisor with independent power-up delays. The Izaguirre, Sr. U.S. Pat. No. 4,825,328, is a three phase electrical load protection device which has an input transducer for protecting each phase voltage in the direction of rotation of the phases of a three phase power system. A control monitor monitors signals from the input transducer representative of the highest and lowest phase voltage in the direction of the rotation of the phases for controlling an output device for disconnecting the electric load when improper supply conditions are detected. The Hsieh U.S. Pat. No. 4,507,713, is a wide range multiphase undervoltage detection circuit which detects a multiphase input voltage compared to a reference voltage. The Schoenmeyr U.S. Pat. No. 4,333,119, is a power monitor system which monitors electrical three phase power in order to protect three phase equipment from excessive variations in line voltage, phase-to-phase unbalanced and reverse phase sequencing and to protect personnel against the automatic restart of equipment upon return of line power. The Yeasting U.S. Pat. No. 4,333,050, teaches a multiphase voltage monitor which continuously compares the voltage on each phase of the power line with a reference voltage to detect voltage unbalance and with fixed voltages to detect high or low voltage conditions.

The present invention is for an electric motor monitoring circuit which monitors electric motor insulation leakage and power line disruptions, such as phase loss, phase imbalance, phase reversal, and low or high voltage, while the motor is operational and will prevent the operation of the motor in the event of a predetermined measured motor winding leakage and will stop the operation of an operational electric motor upon measuring of predetermined phase loss unbalance or reversal or a high or low voltage.

SUMMARY OF THE INVENTION

An electric motor monitoring circuit apparatus for an electric motor has a three phase electric motor having an electric motor starter circuit. An insulation monitoring circuit is coupled to the electric motor and monitors insulation leakage of the electric motor and inhibits activation of the electric motor starter circuit when an insulation leakage exceeds a preselected threshold. The insulation monitoring circuit has a single phase AC power supply for activating the electric motor starter circuit. A three phase monitor circuit is coupled to the electric motor for monitoring phase sequence in voltage amplitude for the electric motor. A relay circuit has a relay coupled to and activated by the three phase monitoring circuit and is coupled to an insulation monitoring circuit relay to inhibit activation of the electric motor upon detection of incorrect phasing or voltage in the electric motor so that operation of an electric motor is inhibited by the detection of incorrect phasing or voltage in the motor and when insulation leakage exceeds a preselected threshold. The phase monitor relay contacts are in series with an insulation tester motor start relay so that both relays must be activated to apply power to the motor start circuit. In addition, the insulation monitoring circuit closes a set of contacts to provide a ground return for the motor start circuit only when the insulation monitor has determined the motor has passed the insulation monitor's test.

BRIEF DESCRIPTION OF THE DRAWINGS

Other objects, features, and advantages of the present invention will be apparent from the written description and the drawings in which.

DETAILED DESCRIPTION OF THE PREFERRED EMBODIMENT

Figure 1:
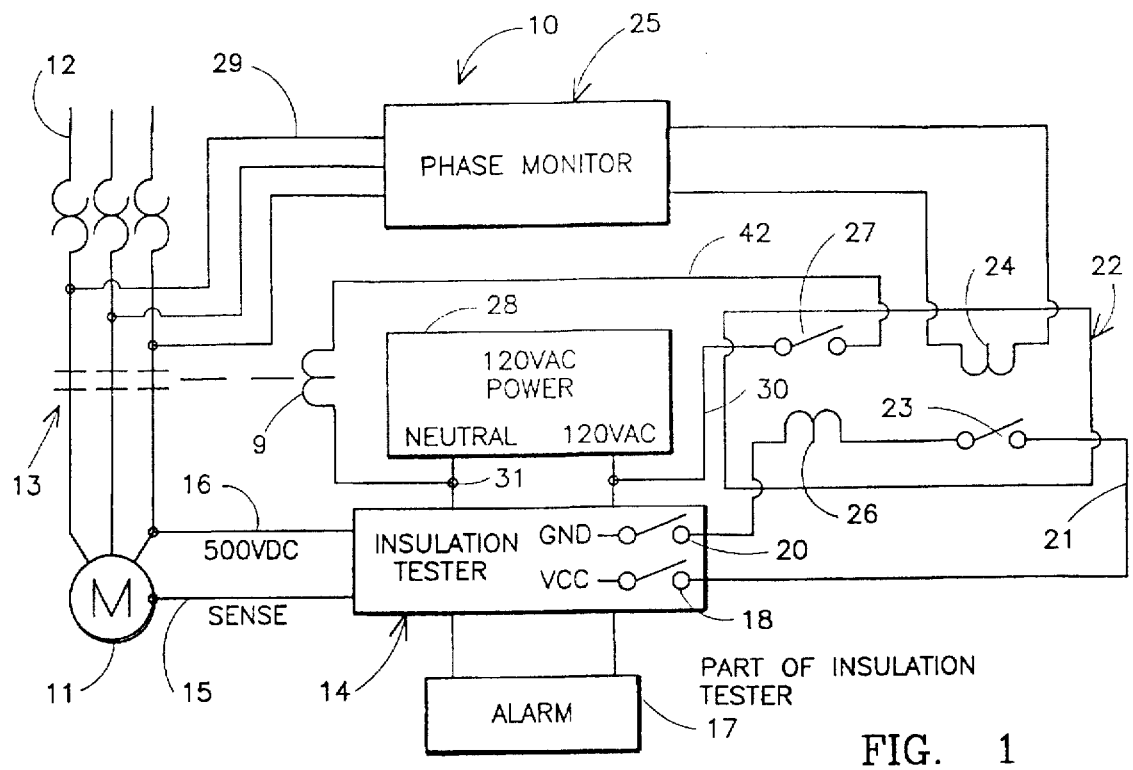
FIG. 1 is a block diagram of an electric motor monitoring circuit in accordance with the present invention.

Referring to the drawings and to FIG. 1, an electric motor monitoring circuit 10 monitors an electric motor 11 connected to a three phase electric motor power source 12. A motor starter circuit 13 has a motor starter coil 9 for activating the motor starter. An insulation tester circuit 14 is connected to the line 15 to the motor 11 and has a line 16 connected through a relay 19 to one of the motor power lines 12. The relay 19 is a high voltage relay actuated by a timing circuit, such as a 12 second timer, during the insulation measurement to connect the sense lead to the primary three-phase voltage. The insulation monitor 14 is connected to an alarm 17 and includes a voltage relay 18 and a ground relay 20. The output line 21 is connected to a relay circuit 22 having a first relay 23 actuated by the relay coil 24. The relay coil 24 supplies electric current from the phase monitor 25 to activate the relay which in turn passes an electric current through the relay coil 26 to activate the relay 27 provided the insulation monitor relay 20 is connected to allow the line 21 to connect to ground. The insulation monitor 14 is supplied with power, such as 120 volt single phase AC power from a power supply 28. The power supply connects through a line 30 which passes through the relay 27 when closed and forms a circuit through the motor starter coil 9 and back to the neutral line 31. The motor starter 13 is activated by the 120 volt AC power supply 28 when the relay 27 is closed by the flow of electric current through the circuit 21 to actuate the coil 26 which occurs only when the relay 23 is closed as well as when the switches 18 and 20 are closed by the insulation monitor.

The control path of the motor starter coil 9 operates the motor start relay 13 by the insulation monitor 18 to complete the control path through the coil. However, both the phase monitor 25 and the insulation monitor 14 are required to allow the motor start relay 13 to be energized. The phase monitor controls the activation of a relay 23 whose contacts are in series with the coil of the insulation monitors motor relay. If the contacts of the relay 23 are closed, the required power is applied to the coil of the motor start relay 13. The control path, however, is not complete until the insulation monitor 14 has determined that the motor has passed the insulation test. When this occurs, another set of contacts 20 will close to provide a ground return for the coil and allow the motor start relay to energize and the motor will begin operation.

Figure 2:
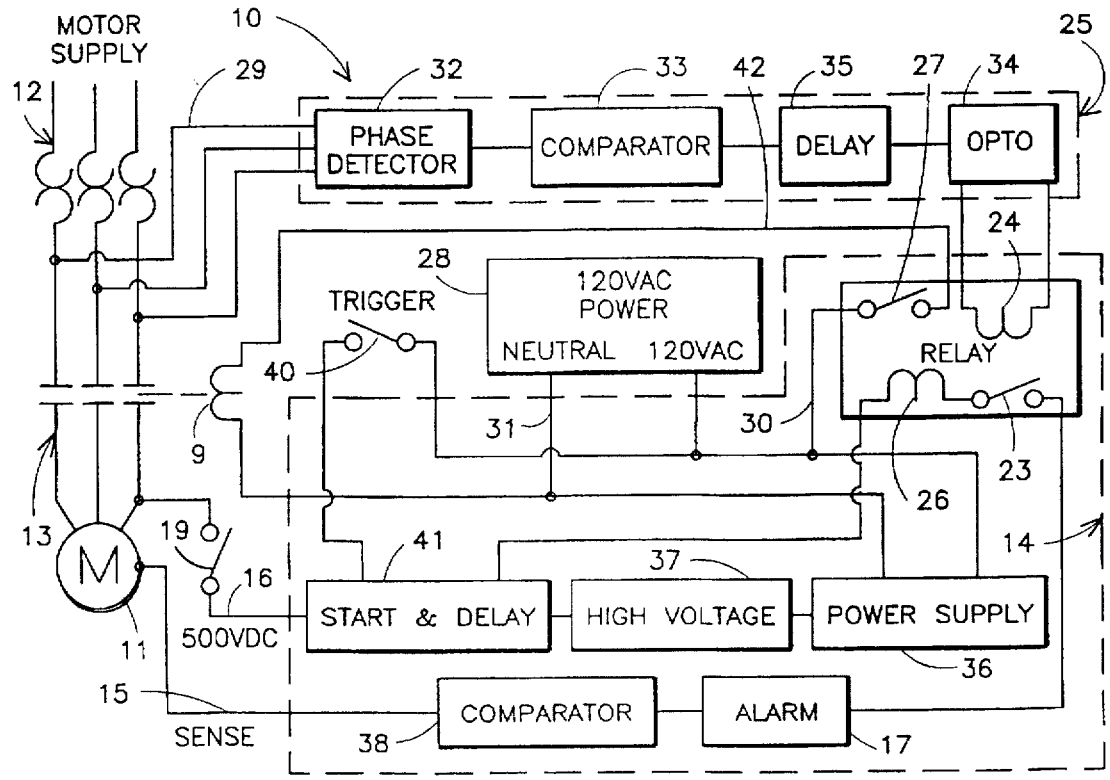
FIG. 2 is an expanded block diagram of the electric motor monitoring circuit of FIG. 1.

Turning to FIG. 2, a more detailed block diagram of the electric motor monitoring circuit in accordance with the present invention is illustrated having the electric motor monitoring circuit 10 having the phase monitoring circuit 25 composed of four sections. The phase detector 25 is connected through the conductors 29 to the three phase motor supply lines 12 and are connected to the phase detector 32. The phase detector detects and translates all normal phase and phase error conditions from the motor supply lines 12 into voltages that are evaluated in a comparator circuit 33. The comparator section is a window comparator circuit that compares the voltage from the phase detector to two reference voltages, one reference voltage is higher and the other is lower than the phase detector voltage under normal phase conditions. If phase errors occur, the voltage from the phase detector will be above or below the reference voltages and cause the OPTO section 34 to deenergize. The OPTO section isolates the phase monitor three phase power operation from the insulation tester 14 voltage environment while allowing the control signal from the phase monitor to control a section of the insulation testers circuitry. This deactivates the normally ON relay 24 that will interrupt the voltage path of the insulation tester's 14 motor start relay coil 9. The reference voltages create a range of voltages or window of operation that the phase detector 32 voltage can vary about and still not cause a phase error condition. Hysteresis is provided so that there will be a dead zone between the normal operation and the phase error conditions so that small line variations will be canceled out.

A delay circuit 35 provides a time delay before a phase error condition is declared. This is primarily to avoid nuisance dropouts due to momentary phase errors. An example of this type of phase error would be when heavy machinery comes on line with existing equipment to create a current surge on the three phase line. This condition will cause the live voltage to sag momentarily and the phase detectors voltage to drop below its lower reference voltage. As a result, the phase monitor will deenergize the motor starter 13 and stop the equipment operation. When the line voltage rises to normal due an unloaded line, the phase monitor 10 will attempt to energize the motor starter but will shut down when the current surge causes the line voltage to sag again. To avoid a disaster, a time delay of less than 5 seconds before the phase error condition is declared will allow heavy machinery to come up to speed so that the line voltage will rise and normal operation can begin. Reference can be had to the three phase monitor circuit in the Grant U.S. Pat. No. 4,823,227, for a phase monitor circuit.

The insulation monitor 14 has a transformer AC to DC power supply 36 that provides a 12 volt DC to all of the relays and to the integrated circuits. It also provides a 5 volt DC source which acts as a reference voltage and operates an oscillator circuit in the high voltage section 37. The high voltage section 37 includes an oscillator driving the primary of a step-up photoflash type transformer whose secondary is rectified and filtered to approximately 500 volts DC and 500 microamps. The insulation monitor is basically a "force a voltage sense a current" type. The 500 volt DC is applied to the motor windings and any leakage current that is sensed will be evaluated in the comparator 38. If the current sensed by the sensing lines 15 develops a voltage higher than the five volt DC reference of the comparator 38, the alarm 17 becomes active. When this condition occurs, a double pole double throw alarm relay is energized. One set of the DPDT contacts activates a local remote alarm. The other set of contacts interrupts the voltage path to the motor start relay coil 9 so that the motor cannot start. If the current sensed develops a voltage that is below the five volt DC reference, the motor start relay 14 will be activated upon the completion of the insulation testing period. The insulation leakage testing period starts when the manual trigger 40 activates the start and delay circuit 41. The trigger 40 can be actuated by a mercury switch or the like positioned in a wet well by the rising water level. The start and delay circuit 41 controls the relay that applies the 500 volt DC to the line 16 to the motor windings and initiates a 15 second delay to allow the comparator circuit 38 to evaluate the insulation resistance of the motor windings. If the insulation leakage test is successful, than the 500 volt DC is removed from the line 16 and the motor windings and the motor start relay 13 is allowed to energize. If the insulation leakage test is not successful, the alarm section 17 will not allow the motor start relay 13 to energize. An insulation testing circuit can be seen in our prior U.S. Pat. No. 4,716,487, to Horvath et al. and reference may be had to this patent for the operation of the circuit.

Phase monitor circuit 25 derives its operating voltage through the lines 31 and may, for instance, be a 230 volt AC three phase power line while the insulation tester 14 operates from a single phase 120 volt AC power supply 28. However, the phase error indication of the phase monitor circuit requires the insulation monitor 14 power supply 28 to be active for a valid indication of the phase error so the single phase 120 volt AC power supply 28 is energized before the three phase power supply 12 is energized. The three phase monitor 25 must sense that the three phase line voltage in the lines 12 or that there are no phase errors before the insulation monitoring circuit 14 can be operated.

Once the insulation monitor has been triggered with a manual trigger 40 and the motor windings have passed the insulation test, the motor will energize and motor operation will commence. If a phase error occurs in the startup sequence, a phase error indication will flash and the insulation monitor will not be able to perform its test even though the trigger 40 to the insulation monitor has been activated. If a phase error occurs while the motor 11 is running, the phase error indication will flash and the motor starter 13 will drop out, causing the motor operation to cease. Once the phase error is corrected, the motor operation will start immediately unless a delay in the delay circuit 35 is used.

The startup sequence for the circuit 10 involves first applying a single phase 120 VAC power from the power supply 28 to the motor starter relay coil 9 line 42, then measuring the three phase voltage from the motor supply lines 12 with the phase monitor 10 and adjusting the voltage on the phase monitor for the measured value. A three phase line voltage is then applied to the motor supply 12 through the lines 29 to the phase monitor 10. If a phase error indication is not indicated, the trigger 40 triggers the insulation monitor 14 by applying 120 volt AC to the power supply 36 and to the start delay circuit 41. If the motor passes the insulation monitor's test, the motor starter 13 will energize the motor 11 and motor operation will commence.

It should be clear at this time that the electric motor monitor for monitoring a circuit has been provided which will deactivate the electric motor before the machinery starts operating whenever the monitoring circuit has detected an insulating leakage of the electric motor windings of a predetermined level and will deactivate the electric motor whenever a three phase monitor circuit has detected incorrect phasing or voltage. However, the present invention is not to be considered as limited to the forms shown which are to be considered illustrative rather than restrictive.

I claim:

1. An electric motor monitoring circuit for an electric motor comprising:

an three phase electric motor having an electric motor starter circuit;

an insulation monitoring circuit coupled to said electric motor for monitoring insulation leakage of said electric motor and to inhibit activation of said electric motor starter circuit when insulation leakage exceeds a preselected threshold, said insulation monitor circuit having a power supply for activating said electric motor starter circuit;

a three phase monitor circuit coupled to said electric motor for monitoring phase sequence and voltage amplitude for said electric motor; and a relay circuit having an insulation monitoring circuit relay in said starter circuit to inhibit operation of said electric motor in an open position and having a three phase monitoring circuit relay activated by said three phase monitoring circuit to inhibit operation of said electric motor when in an open position, whereby operation of an electric motor is inhibited by detection of insulation leakage current exceeding a preselected threshold and operation of said electric motor ceases upon measuring incorrect phasing or voltage therein.

2. An electric motor monitoring circuit for an electric motor in accordance with claim 1 in which said insulation monitoring relay is actuated only when said three phase monitoring circuit relay is actuated to apply a current through the coil of said insulation monitoring relay to thereby pass a current through said electric motor started circuit.

3. An electric motor monitoring circuit for an electric motor in accordance with claim 2 in which said electric motor is a three phase electric motor operated by a three phase electric source and said a insulation monitoring circuit power supply is a single phase electric power source connected across said motor starter circuit through said relay circuit.

4. An electric motor monitoring circuit for an electric motor in accordance with claim 3 in which said insulation monitoring circuit power supply is a single phase electric power source of around 120 VAC and said electric motor power source is a three phase electric power source greater than 200 VAC.

5. An electric motor monitoring circuit for an electric motor in accordance with claim 3 in which a trigger circuit is connected between said relay circuit and said electric motor starter circuit.

6. An method of monitoring an electric motor having an electric motor monitoring circuit coupled to an three phase electric motor having an electric motor starter circuit and having an insulation monitoring circuit coupled to the electric motor for monitoring insulation leakage of the electric motor and to inhibit activation of said electric motor starter circuit when the insulation leakage exceeds a preselected threshold, said insulation monitor circuit having a power supply for activating said electric motor starter circuit, and said electric motor monitoring circuit also having a three phase monitor circuit coupled to said electric motor for monitoring phase sequence and voltage amplitude for said electric motor and a relay circuit having an insulation monitoring circuit relay in said starter circuit to inhibit operation of said electric motor in an open position and having a three phase monitoring circuit relay activated by said three phase monitoring circuit to inhibit operation of said electric motor when in an open position comprising the steps of:

applying a single phase voltage across said relay circuit and said electric motor starter circuit;

measuring the three phase voltage of said three phase electric motor power supply with said three phase monitoring circuit;

determining whether there is a phase error in said three phase electric motor power supply and activating a relay in said relay circuit when there is no phase error;

triggering the selected insulation monitoring circuit;

determining whether insulation leakage in said electric motor exceed a predetermined threshold; and starting said electric motor if said electric motor exceed said insulation test, whereby an electric motor monitoring circuit inhibits starting of an electric motor when said electric motor monitoring circuit detects insulation leakage current exceeding a preselected threshold and stops operation of said electric motor upon measuring an incorrect phasing or voltage therein.

\* \* \* \* \*

UNITED STATES PATENT AND TRADEMARK OFFICE
Certificate

Patent No. 5,751,132                          Patented: May 12, 1998

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Joseph G. Horvath, Astatula, Florida; James C. Miller, Tavares, Florida; and Ralph Chin, Longwood, Florida.

Signed and Sealed this Thirteenth Day of July, 1999.

ROBERT E. NAPPI
*Supervisory Patent Examiner*
Art Unit 2837